United States Patent
Nguyen et al.

(10) Patent No.: US 6,841,815 B2
(45) Date of Patent: Jan. 11, 2005

(54) TRANSIMPEDANCE AMPLIFIER ASSEMBLY WITH SEPARATE GROUND LEADS AND SEPARATE POWER LEADS FOR INCLUDED CIRCUITS

(75) Inventors: The' Linh Nguyen, San Jose, CA (US); Daniel K. Case, Gilroy, CA (US); Philip D. Shapiro, Palo Alto, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/285,204

(22) Filed: Oct. 30, 2002

(65) Prior Publication Data

US 2003/0178657 A1 Sep. 25, 2003

Related U.S. Application Data

(60) Provisional application No. 60/366,089, filed on Mar. 19, 2002.

(51) Int. Cl.[7] .............................. H05K 1/11; H01L 29/76
(52) U.S. Cl. ....................... 257/293; 257/292; 257/528; 361/173
(58) Field of Search .................................. 257/250, 292, 257/293, 528; 361/173

(56) References Cited

U.S. PATENT DOCUMENTS

| | | | | |
|---|---|---|---|---|
| 4,691,386 A | * | 9/1987 | Eumurian et al. | .......... 398/139 |
| 2003/0102157 A1 | * | 6/2003 | Rosenberg et al. | .......... 174/261 |

* cited by examiner

*Primary Examiner*—Minhloan Tran
*Assistant Examiner*—Thomas L Dickey
(74) *Attorney, Agent, or Firm*—Workman Nydegger

(57) ABSTRACT

The optoelectronic device includes a photo diode and an amplifier, which amplifies output of the photo diode. The amplifier includes an input stage and an output stage. In one embodiment, the input stage has a series connection to a resistor, which is connected to a ground. The output stage has a connection to ground that does not overlap the series connection. In another embodiment, the input stage has a first connection to a bypass capacitor, which is connected to a power source. The output stage has a separate, second connection to the capacitor, which prevents high frequencies from flowing between the input stage and said output stage via a connection to the power source.

12 Claims, 13 Drawing Sheets

US 6,841,815 B2

TRANSIMPEDANCE AMPLIFIER ASSEMBLY WITH SEPARATE GROUND LEADS AND SEPARATE POWER LEADS FOR INCLUDED CIRCUITS

The present application claims priority, under 35 U.S.C. 119(e), to a U.S. Provisional Patent Application bearing Ser. No. 60/366,089, filed Mar. 19, 2002, which is incorporated herein by reference.

BRIEF DESCRIPTION OF THE INVENTION

The present invention relates generally to optoelectronic devices, and particularly to a circuit interconnect for controlled impedance at high frequencies.

BACKGROUND OF THE INVENTION

An optoelectronic device, such as a laser diode or a photo diode, is generally enclosed in a transistor outline (TO) package, which provides a conductive housing for the optoelectronic device. A laser diode converts an electrical signal into an optical signal for transmission over a fiber optic cable, while a photo diode converts an optical signal into an electrical signal. In order for a laser diode to convert an electrical signal into an optical signal, the electrical signal must be sent through the TO package of the laser diode. Similarly, an electrical signal from a photo diode must be sent through the TO package of the photo diode to external electrical circuitry. For high frequency operation, it is important to control the impedance seen by the electrical signals that flow into and out of the TO package.

TO package also include amplifiers to amplify the output of the photo diode. Conventional amplifiers have common ground and power signals for the various elements of the amplifier, which results in feed back gain and oscillations at high frequencies (e.g., above 5 GHz).

SUMMARY OF THE INVENTION

The present invention enables optoelectronic devices packaged in transistor outline (TO) packages to operate at high frequencies.

The optoelectronic device includes a photo diode and an amplifier, which amplifies output of the photo diode. The amplifier includes an input stage and an output stage. In one embodiment, the input stage has a series connection to a resistor, which is connected to a circuit ground. The output stage has a connection to circuit ground that does not overlap the series connection. In another embodiment, the input stage has a first connection to a capacitor, which is connected to ground and a power source. The output stage has a second connection to the capacitor, which prevents high frequencies from flowing between the input stage and said output stage via a connection to the power source.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
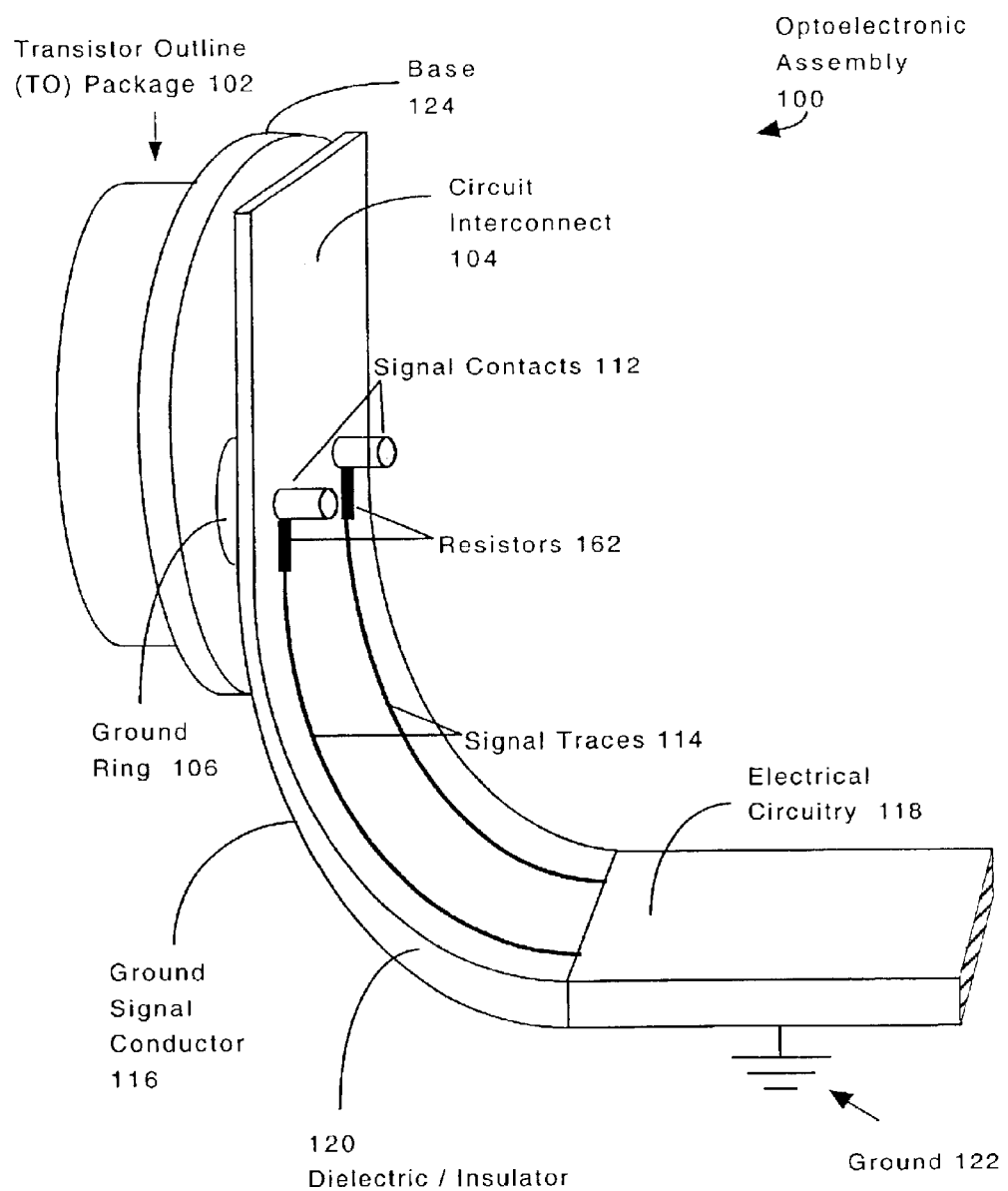
FIGS. 1 and 1A–1F are various diagrams of an optoelectronic assembly in accordance an embodiment of the invention.

Referring to FIG. 1, there is shown an embodiment of an optoelectronic assembly 100 in accordance with the present invention. The optoelectronic assembly may be a transmitter optoelectronic assembly or a receiver optoelectronic assembly. The optoelectronic assembly includes an optoelectronic device or component having a housing that is called a transistor outline (TO) package 102. If the optoelectronic assembly is a transmitter optoelectronic assembly, the optoelectronic device is a light source such as a laser diode. If the optoelectronic assembly is a receiver optoelectronic assembly, the optoelectronic device is a detector such as a photo diode.

Signal contacts 112, also called signal leads, extend through apertures in the base 124 of the TO package 102 and a circuit interconnect 104. The signal contacts 112 are electrically connected to the signal traces 114. The signal contacts 112 and the signal traces 114 convey power and data signals between an external circuit 118 and the device or devices in the TO package 102.

Figure 7:
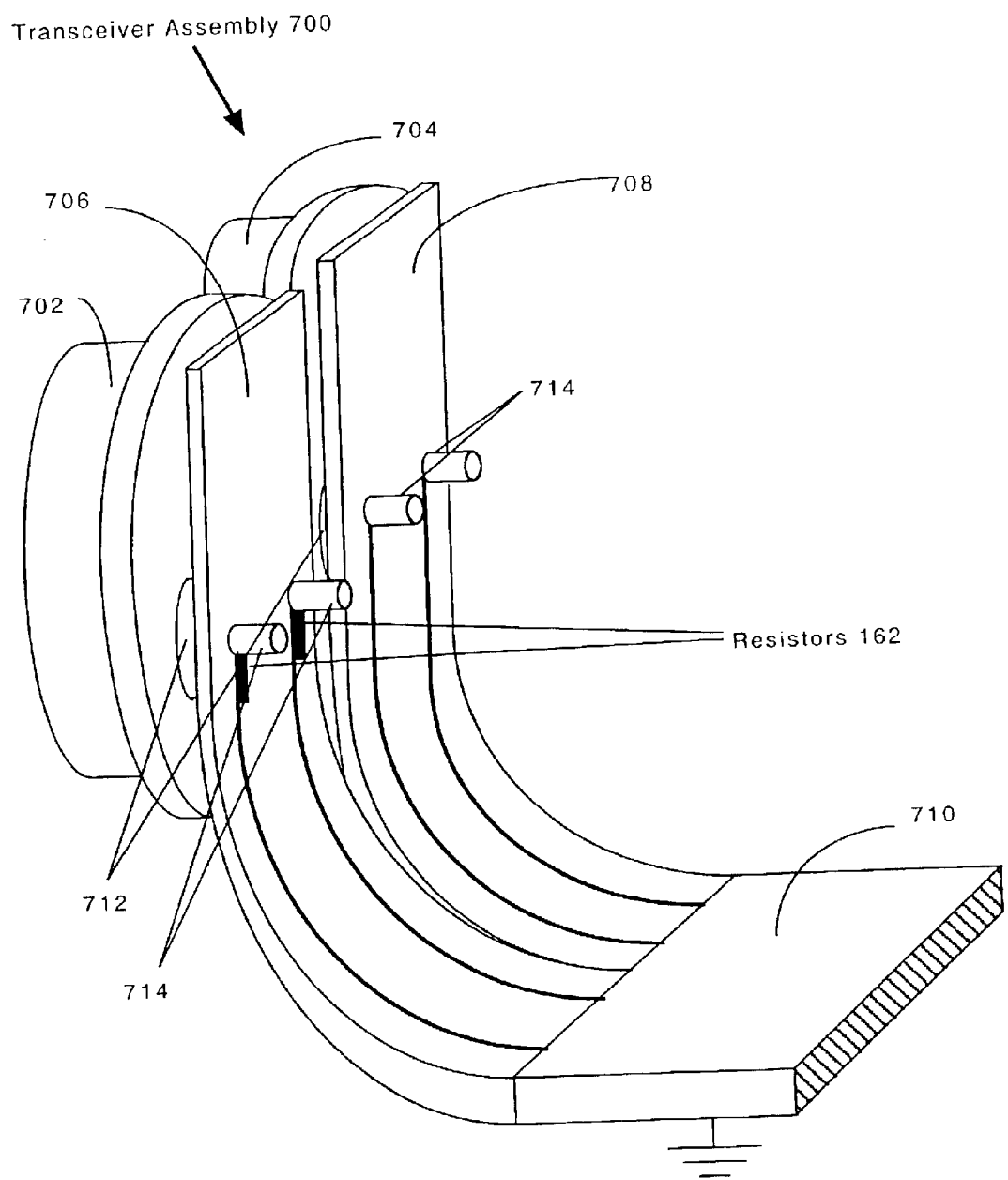
FIG. 7 is a diagram of a transceiver assembly in accordance with an embodiment of the invention.

Additionally, resistors 162 are preferably electrically connected in series with the signal traces 114 and the signal contacts 112. In preferred embodiments, very short signal trace segments (not shown) are mechanically and electrically connected to the signal contacts 112. The resistors 162 are then mechanically and electrically connected to the short signal trace segments and the signal traces 114 by solder, conductive epoxy, or any other appropriate conductive attachment mechanism. In other embodiments, the resistors are connected directly to the signal contacts 112. Additionally, resistors 162 are generally not used for power connections between the external circuit 118 and the TO package 102. Finally, in some embodiments, the resistors 162 are used in this way only for transmitter optoelectronic assemblies (as illustrated in FIG. 7).

The circuit interconnect 104 is preferably made of an elongated piece of flexible dielectric 120. The dielectric 120 serves as an insulator between a ground signal conductor 116 on one side of the dielectric 120 and the resistors 162 and data signal traces 114 on the other side of the dielectric. The ground signal conductor 116 conveys ground current between the external circuit 118 and the device or devices in the TO package 102. While the embodiment shown in FIG. 1 has two signal contacts 112, resistors 162, and corresponding signal traces 114, in other embodiments the number of signal contacts 112, resistors 162, and signal traces 114 may be greater or fewer, depending on the number of power and data connections needed by the device or devices inside the TO package 102.

Positioning the resistors 162 on the circuit interconnect 104 is an improvement over systems that include resistors inside the TO package 102. As is known in the art, resistors dissipate heat. When a resistor is included inside the TO package 102 (e.g., a thin film resistor disposed on the submount 404 illustrated in FIG. 4), the resistor may increase the internal temperature of the TO package 102, which has a negative impact on the performance of the device or devices in TO package 102. Additionally, it is easier to replace resistors 162, or dynamically determine and then install appropriately sized resistors, after construction of the optoelectronic assembly when the resistors are positioned on the circuit interconnect 104 instead of inside the TO package 102. The small size of the TO package makes replacement of resistors in the TO package difficult. Using normal manufacturing techniques, the TO package is sealed closed prior to operation of the laser diode in the TO package, making replacement of any components in the TO package, or requiring that manufacturing techniques be modified to enable dynamic sizing of the resistors in the TO package during manufacture of the optoelectronic component.

Figure 1A:
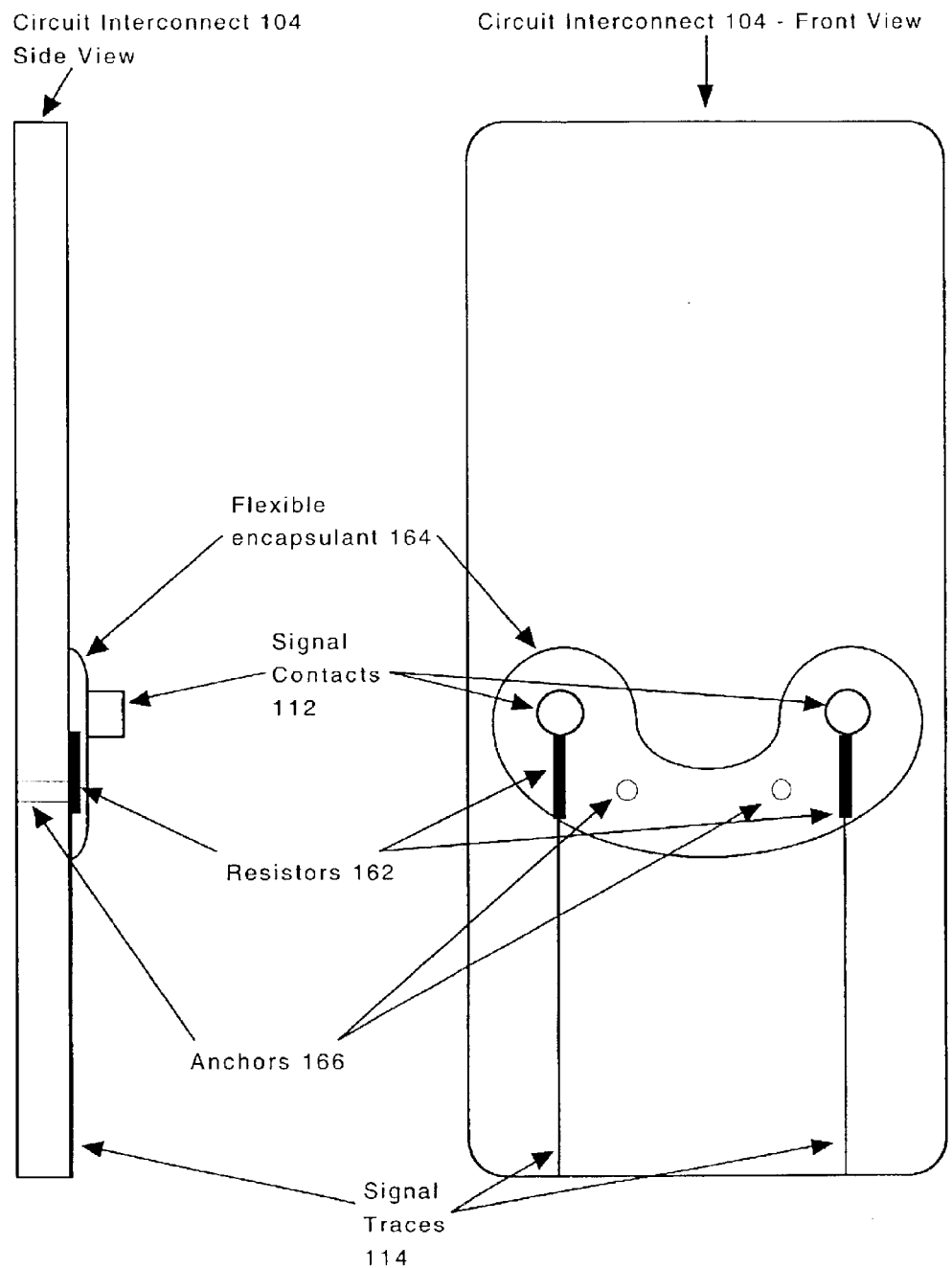

Embodiments that include a flexible dielectric 120 preferably use a flexible encapsulant 164 (e.g., a material known as "glob top") to secure the resistors 162 on the circuit interconnect 104. As illustrated in FIG. 1A, the flexible encapsulant 164 is deposited on top of the resistors 162, the portion of the circuit interconnect 104 immediately surrounding the resistors 162, and the signal traces 114. As a result, the resistors 162, the contact points between the resistors 162 and the signal contacts 112, the contact points between the resistors 162, and the signal traces 114 are fully covered by the flexible encapsulant 164. Typically, the flexible encapsulant 164 is deposited and cured to form a bond with the circuit interconnect 104, the resistors 162, and the signal traces 114. When the flexible dielectric 120 is flexed, the flexible encapsulant 164 holds the resistors 162 in place, thus relieving stress that would otherwise be placed on the connections between the resistors 162 and the signal contacts 112 and on the connections between the resistors and the signal traces 114. The present invention may be practiced using coverage patterns of the flexible encapsulant 164 other than the particular pattern illustrated in FIG. 1A.

Some embodiments of the invention that incorporate the use of the flexible encapsulant 164 also incorporate the use of anchor holes 166 in the circuit interconnect 104 as illustrated in FIG. 1A. Both the front and back sides of the anchor holes 166 are preferably completely covered by the flexible encapsulant 164. The anchor holes 166 provide for a more secure connection between the flexible encapsulant 164 and the circuit interconnect 104. When applied to the circuit interconnect 104, the flexible encapsulant 164 flows through the anchor holes 166, which provide the flexible encapsulant 164 with edges to "grip" onto the circuit interconnect 104. In the embodiment illustrated in FIG. 1A, two anchor holes 166 are shown, but in alternate embodiments, a larger or small number of anchor holes 166 are used. The invention, moreover, is not limited to the specific positioning of the anchor holes 166 illustrated in FIG. 1A. so long as other elements (e.g., signal traces 114) on the circuit interconnect 104 are avoided.

The external, back surface of the base 124 (of the TO package) is sometimes called the "ground plate," because the base 124 of the TO package is grounded by a connection between the ground plate and the ground conductor 116 on the circuit interconnect 104. The ground connection to the base 124 provides a circuit ground voltage source and ground current connection for the electrical and optoelectronic components in the TO package 102.

To avoid signal reflections and other signal degradations, the impedance of the signal path from the device or devices in the TO package 102 to the external circuit 118 must be kept as consistent as possible. The characteristic impedance (also called the transmission line impedance) of the signal traces 114 is precisely determined by the thickness of the dielectric and the width of the data signal traces 114. This characteristic impedance is preferably set so that for signals in a predefined frequency range (e.g., 20 kHz–10 GHz), the characteristic impedance of the signal traces approximately matches the impedance of the external circuit 118 and also approximately matches the impedance of the device or devices in the TO package 102 as measured from the point of connection between of the signal traces 114 and the resistors 162 (and thus includes the impedances of the resistors 162, signal contracts 112, bond wires in the TO package, and so on).

As used in this document, two impedances are defined to "approximately match" when the two impedances are either exactly the same or one of the impedances is larger than the other, but no more than 50% larger. In other words, the impedance of the signal traces 114 are within a factor of about 1.5 of the impedance of the external circuit 118 and are also within a factor of about 1.5 of the impedance of the device or devices in the TO package 102 (including the impedance of the resistors 162, signal contacts 112 and bond wires in the TO package). Preferably the impedance of the signal traces 114 is within 25% (i.e., within a factor of about 1.25) of the impedances of the external circuit 118 and the device or devices in the TO package 102. When the device in the TO package is a transmitter, the impedance of the signal traces 114 is typically between 20 and 30 ohms, and the impedance of each of the resistors 162 is approximately 18 ohms. Note that transmitter devices typically included in the TO package 102 (e.g., a laser diode) and the signal contacts 112 are generally low impedance devices. As a result, the resistors 162 are the primary means of approximately matching the impedance of the device or devices in the TO package 102, as measured from the point of connection between the signal traces 114 and the resistors 162, to the impedance of the signal traces 114. When the device in the TO package 102 is a receiver (e.g. photo diode), the impedance of the signal traces 114 is typically 50 ohms and, typically, no resistors 162 are used. However, in other embodiments, resistors 162 may be used in conjunction with a receiver device in the TO package 102.

In a preferred embodiment the circuit interconnect 104 has a thickness between 0.003 and 0.012 inches, and the dielectric substrate 120 of the circuit interconnect is preferably polyimide or polyester. Other insulating materials may be used besides polyimide or polyester. Moreover, the insulator 120 does not necessarily need to be flexible; however, the flexibility is useful for fitting the optoelectronic assembly 110 into a housing (not shown), such as the housing of an optoelectronic transmitter, receiver or transceiver. The flexible dielectric substrate 120 is coated on each side with a conductive material such as copper, a copper alloy, or other malleable, highly conductive metal or metal alloy. The data signal traces 114 are fabricated from the conductive material on one side of the circuit interconnect 104, while the entire second side of the circuit interconnect 104 (excluding circular regions corresponding to the positions of the signal leads 112 traversing the base of the TO package and the anchor holes 166) serves as the ground signal conductor 116. Other methods of creating the conductive signal traces may be used as is understood by one skilled in the art.

In an alternate embodiment, only a portion of the second side of the circuit interconnect 104 serves as the ground signal conductor 116, leaving room for one or more additional signal traces (e.g., for power or low frequency data signals) on the second side of the interconnect 104. In this alternate embodiment, the ground signal conductor 116 would be positioned relative to the traces on the first side of the circuit interconnect so as to provide connections with well controlled impedance.

Figure 2:
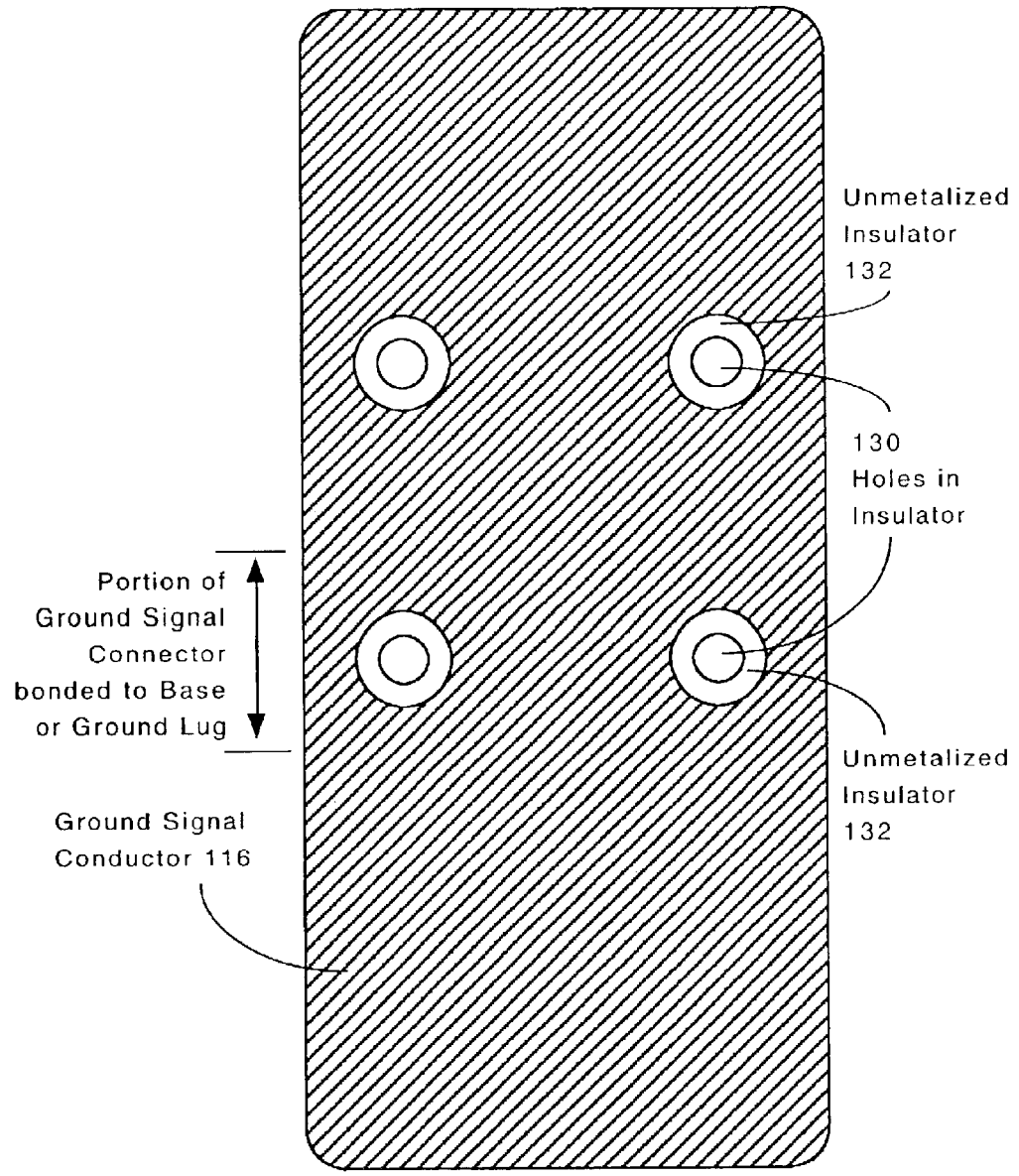
FIG. 2 depicts the ground signal conductor side of a circuit interconnect.

The side of the circuit interconnect 104 that serves as the ground signal conductor 116 is depicted in FIG. 2. The small circular regions 130 represent holes in the dielectric substrate 120 of the interconnect, through which the signal leads of the TO package extend. The annular circular regions 132 surrounding the smaller holes 130 represent non-conductive, unmetalized regions in which the conductive material has been removed from the second side of the circuit interconnect 104 so as to prevent electrical shorts between the signal leads and the ground signal conductor 116.

Returning to FIG. 1, the data signals are transmitted between the optoelectronic device in the TO package 102 and electrical circuitry 118. The data signal contacts 112 extend through apertures in the base 124 of the TO package 102 and contact the resistors 162. For each data signal contact 112, a separate, respective ground ring 106 surrounds the data signal contact 112 and is attached to the base 124 of the TO package 102. The base 124 is a circular (actually, cylindrical) metal plate, generally held at the circuit ground voltage during operation of the optoelectronic device. The base 124 is the foundation of the TO package 102. In a preferred embodiment the base 124 is made of a metal known as "Alloy 42," which is an alloy of iron and nickel. In other embodiments the base 124 may be made of other appropriate metals. The primary purpose of the ground rings 106 is to form a low reflection connection between the data signal contacts 112 and the signal traces 114, so as to minimize signal reflections at the interface between the data signal contacts 112 and the signal traces 114 (or at the interface between the data signal contacts 112 and the resistors 162).

Figure 3A:
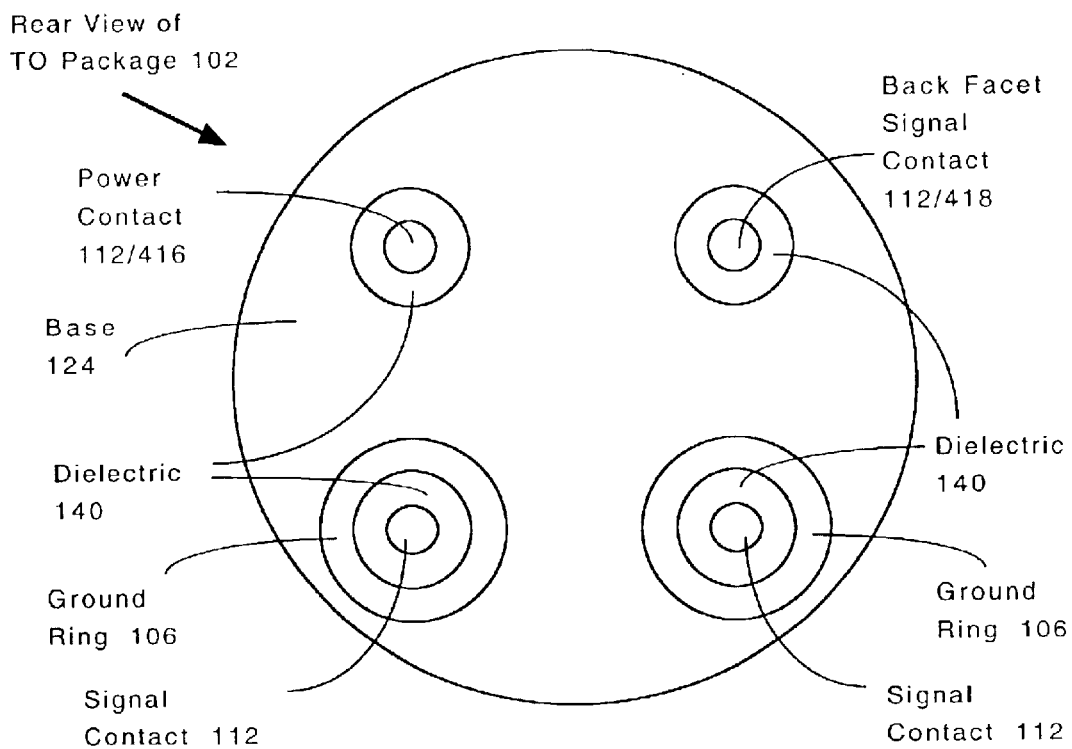
FIGS. 3A and 3B depict the back of a TO package in accordance with the first and second embodiments.

FIG. 3A shows the ground rings 106 on the back surface of the base 124. The ground rings 106 are preferably highly conductive, thin metal rings that are bonded to the back, planar surface of the base 124, such as by solder, conductive epoxy, or any other appropriate bonding or conductive attachment mechanism. As a result, the ground rings are mechanically and electrically connected to the back surface of the base 124. The ground rings 106 rise slightly above the back planar surface of the base 124, which facilitates the bonding of the ground signal conductor 116 of the circuit interconnect 104 to the ground rings. Alternately, the ground rings 106 may be implemented as raised annular regions of the base 124, and thus as integral parts of the base. The circuit ground connection provided by the ground signal conductor 116, which is electrically and mechanically bonded to the ground rings 106, and possibly other portions of the base as well, keeps the entire base 124 at the circuit ground voltage during normal operation. While the ground rings 106 are shown in FIG. 3A as being circular or annular in shape, in other embodiments other shapes could be used. For instance, the ground rings 106 could be oval shaped structures.

Although there are two ground rings 106 surrounding two data signal contacts, only one ground ring is seen in FIG. 1 because of the angle of the perspective view shown in FIG. 1. The ground signal conductor 116 directly contacts the ground rings 106, and carries ground current from the ground rings 106 to a circuit ground terminal 122 (FIG. 1). In a preferred embodiment, the ground signal conductor 116 also directly contacts the base 124 at the back surface of the TO package 102 so as to provide a high quality ground connection to the entire TO package and the devices therein. These contacts between the ground signal conductor 116 and the ground rings 106 and the back surface of the base 124 are preferably implemented by bonding these components together using solder, conductive epoxy, or any other appropriate bonding or conductive attachment mechanism.

The ground signal and the data signals are maintained in a close relationship to each other, separated by the insulator 120. This provides for a controlled impedance at all frequencies in general and high frequencies in particular, where impedance matching is most important.

Figure 1B:
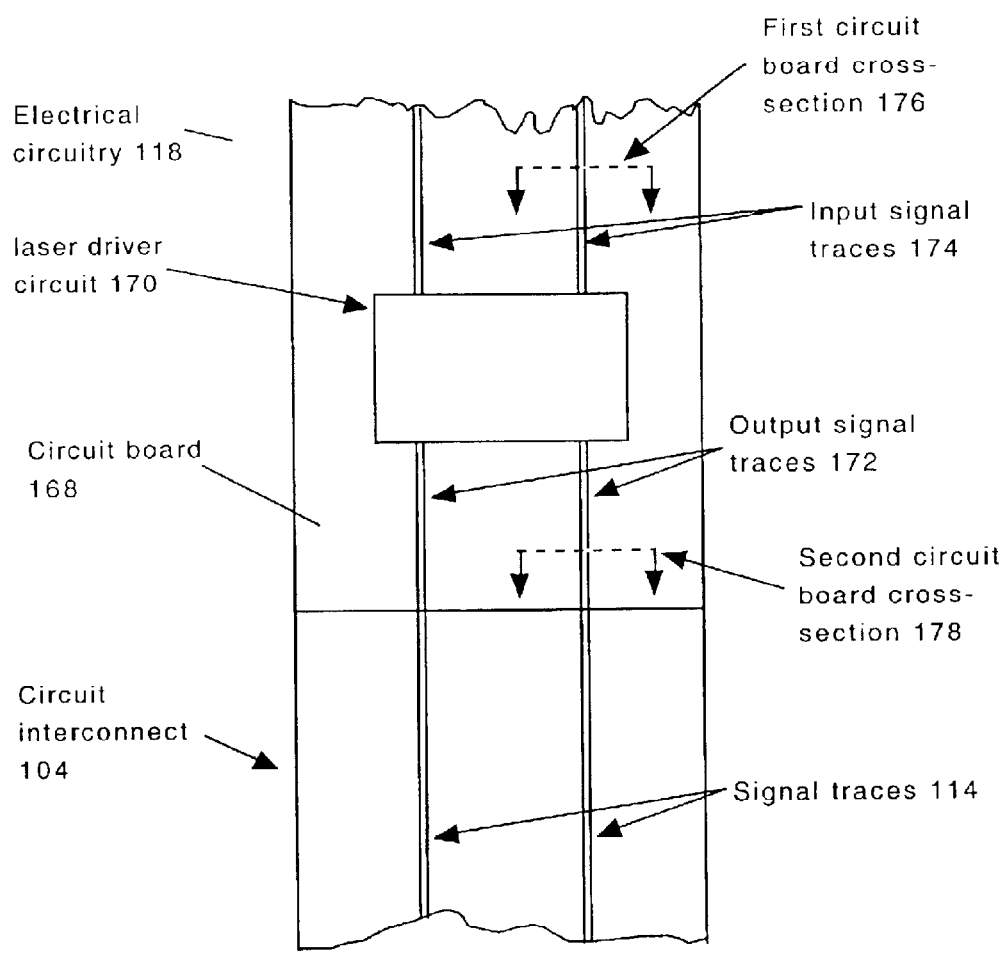

Referring again to FIG. 1, the electrical circuitry 118 amplifies and processes the electrical signals transmitted to a laser diode (the embodiment illustrated in FIG. 1B) or from a photo diode (in another embodiment), or both (in yet another embodiment). Thus, the electrical circuitry 118 may include a laser driver circuit 170 (FIG. 1D), a received signal recovery circuit, or both. Further, the electrical circuitry 118 may include digital signal processing circuits, such as serializing circuits and deserializing circuits, and circuits that perform data conversions, such as the 8$b$/10$b$ conversion for converting a data stream into a "balanced" data stream that is balanced with respect to 1 and 0 bits, and that provides sufficient data transitions for accurate clock and data recovery.

The electrical circuitry 118 is electrically connected to the circuit interconnect 104. The signal traces 114 contact the electrical circuitry 118 while the ground conductor 116 contacts the electrical circuitry's circuit ground node 122. Elements of the electrical circuitry 118 are typically mounted on a circuit board 168 (FIG. 1B), which is electrically connected to the signal traces 114 of the circuit interconnect 104. In particular, output signal traces 172 on the circuit board 168 are connected to the signal traces 114 on the circuit interconnect 104 by solder, conductive epoxy, or any other appropriate bonding or conductive attachment mechanism. The output signal traces 172 are also connected to the output of the laser driver circuit 170. The output of the laser driver circuit 170 drives a laser diode housed in a TO package 102. The input to the laser driver circuit 170 is preferably carried by two or more input signal traces 174. The input carried by the input signal traces 174 is provided by other elements (not shown) internal and external to the electrical circuitry 118.

To avoid signal reflections and other signal degradations within the electrical circuitry 118, the impedances of the output and input signal traces 172, 174 are configured to approximately match the output and input impedance of the laser driver circuit 170 respectively. The output impedance of the laser driver circuit 170 does not, however, match the input impedance of the laser driver circuit 170. In preferred embodiments of the present invention, the input impedance of the laser driver circuit 170 is 50 ohms and the output impedance of the laser driver circuit 170 is 25 ohms. As a result, the impedances of the output and input signal traces 172, 174 do not match. The widths of the output and input signal traces 172, 174 are, however, preferably not varied for impedance matching purposes. More specifically, the widths of the signal traces are preferably fixed at the pad width of series and shunt components connected to the signal traces (e.g., the C circuits 189, RC circuits 190, and RLC circuits 191, 192 illustrated in FIG. 1D). This is so because varying the width of the signal traces 172, 174 or not matching the width of the signal traces to the pad width of the series and shunt components creates discontinuities in the signal paths, which causes signal reflections and signal degradation, particularly for high frequency signals transmitted through the signal traces 172, 174.

Figure 1C:
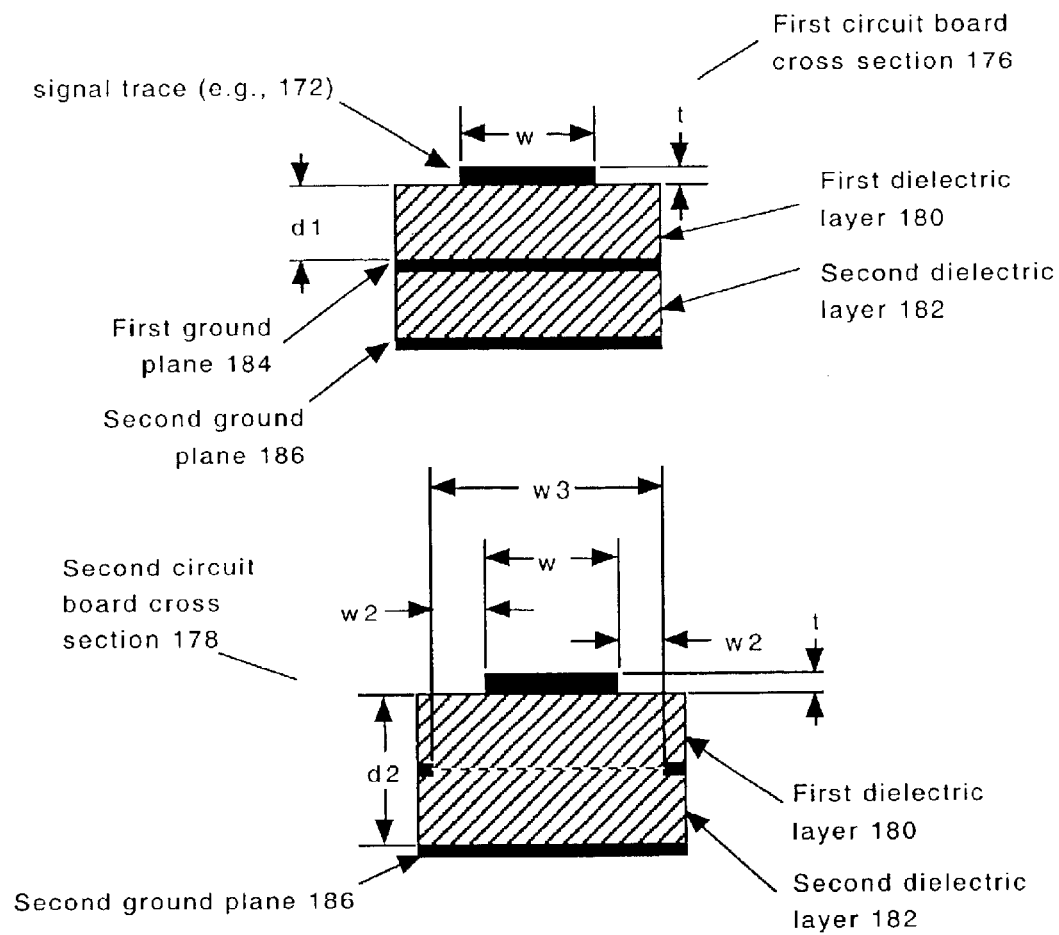

In order to match the impedances of the output and input signal traces 172, 174 to the output and input impedance of the laser driver circuit 170, without varying the widths of the output and input signal traces, the circuit board 168 incorporates two ground planes as illustrated in FIG. 1C. As shown in FIG. 1C (not drawn to scale), a first circuit cross section 176 includes a signal trace (e.g., 172, 174), a first dielectric layer 180, a first ground plane 184, a second dielectric layer 182, and a second ground plane 186. A second circuit board cross section 178 includes a signal trace (e.g., 172, 174), a first dielectric layer 180, a second dielectric layer 182, and a second ground plane 186. Though a first dielectric layer 180 and a second dielectric layer 182 are separately identified in the second circuit board cross section 178, the first dielectric layer 180 and the second dielectric layer 182 effectively form a single dielectric layer.

The second circuit board cross section 178 is essentially the first circuit board cross section 178 with sections of the first ground plane 184 removed. More specifically, sections of the first ground plane 184 are removed from (or not included in) areas of the circuit board 168 close to the input signal traces 174 (the second circuit board cross section 178 is representative of these areas). As illustrated in FIG. 1C, the width of a ground plane section removed (w3) is preferably w+2*w2, where w2 is $\geq 3*d2$. At the very least, enough of the first ground plane 184 is removed to ensure that the first ground plane 184 does not significantly affect the impedance of the input signal traces 174.

The first ground plane 184, however, is not removed from (or is included in) areas of the circuit board 168 close to the output signal traces 172 (the first circuit board cross section 176 is representative of these areas). As a result, the second ground plane does not affect the impedance of the output signal traces 172. Instead, the impedance of the output signal traces 172 is determined in part by the distance of the first ground plane 184 from the output signal traces 172.

Persons skilled in the art recognize that the characteristic impedance of a signal trace (e.g., micro-strip transmission lines) is:

$$\frac{87}{\sqrt{\varepsilon_r + 1.41}} \ln\left(\frac{5.98 * h}{0.8 * w + t}\right)$$

where $\varepsilon_r$ is the dielectric constant, which varies depending on the composition of the dielectric layer 180, 182;

where h (mils) is the distance between the signal trace and the closest ground plane (e.g., d1 for the first circuit board cross section 176 and d2 for the second circuit board cross section 178);

where w (mils) is the width of the signal trace as illustrated in FIG. 1C; and where t (mils) is the thickness of the signal trace as illustrated in FIG. 1C.

In a preferred embodiment, the thickness of the first dielectric layer 180 and the second dielectric layer 182 are chosen so that the characteristic impedance of the input signal traces 174 and the characteristic impedance of the output signal traces 172 are 50 ohms and 25 ohms, respectively. In one embodiment of the present invention, the thickness of the first dielectric layer 180 is 5 mils and the thickness of the second dielectric layer 182 is 8 mils. The other inputs to the characteristic impedance equation above are preferably the same for areas of the circuit board 168 represented by the first circuit board cross section 176 and the second circuit board cross section 178.

In alternate embodiments, varying numbers of ground planes are included in areas of the circuit board 168 as needed to obtain varying numbers of impedances for signal traces. Additionally, such signal traces may or may not interface with a laser driver circuit 170.

Figure 1D:
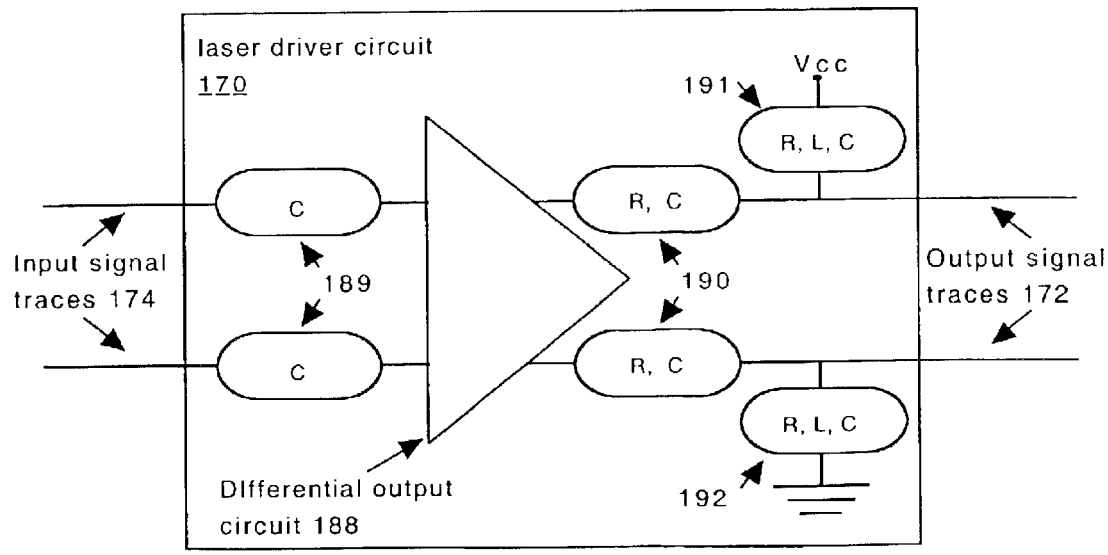

FIG. 1D illustrates components included in the laser driver circuit 170 of a preferred embodiment. In particular, the laser driver circuit 170 preferably includes a differential output circuit 188, two C (capacitor) circuits 189, two RC (resistor-capacitor) circuits 190, and two RLC (resistor-inductor-capacitor) circuits 191, 192, which are connected to a voltage source (Vcc) and ground, respectively. The C and RC circuits 189, 190 are part of an impedance matching network that also includes RLC circuits 191, 192.

The differential output circuit 188 amplifies differential signals from the input signal traces 174. Before being amplified by the differential output circuit 188, however, these differential signals pass through a corresponding C circuit 189. The C circuits 189 preferably include a capacitor in series for DC blocking.

Figure 4:
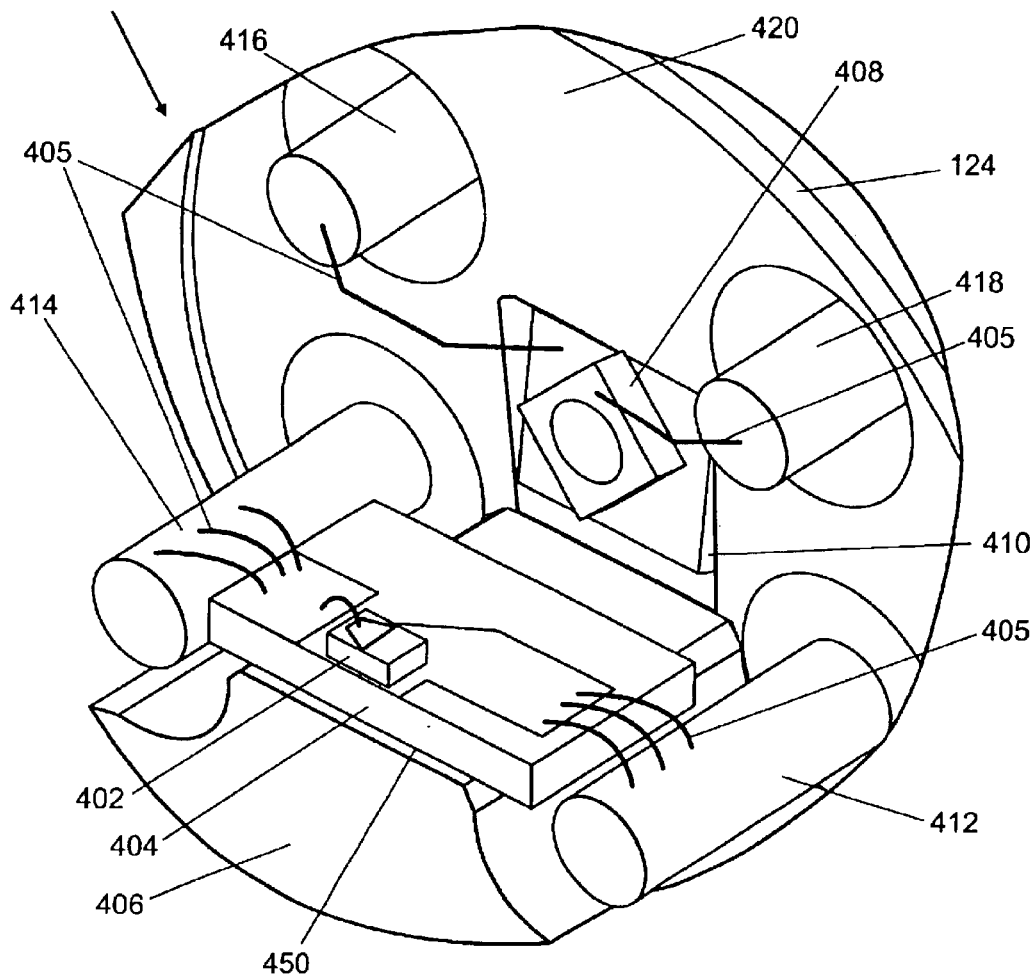
FIG. 4 is a perspective view of a transmitter assembly in accordance with an embodiment of the invention.

The two output signals are high frequency signals that ultimately modulate the output of a laser diode 402 (FIG. 4). But prior to exiting the laser circuit 170, the first and second output signals pass through a corresponding RC circuit 190. The RC circuits 190 isolate the differential output circuit 188 from the RLC circuits 191, 192. More specifically, the RC circuits each provide a DC blocking capacitor and matching resistor to isolate the DC level of the 188 differential output circuit from the RLC circuits 191, 192, which present a high impedance (e.g., an impedance that is five to ten times greater than the signal trace impedance minimum).

The RLC circuit 191 and the RLC circuit 192 provide a biasing current to a laser diode 402 in order to push the laser diode 402 operating range beyond its threshold value and into a linear range. Once in the linear range, the high frequency current provided by the differential output circuit 188 modulates the optical output strength of the laser diode 402. Preferably, the combination of elements selected for the RLC circuit 191 and the RLC circuit 192 are selected such that the voltage drop across each is minimal, yet capable of providing the required biasing current without interfering with the high frequency current provided by the differential output circuit 188.

Figure 1E:
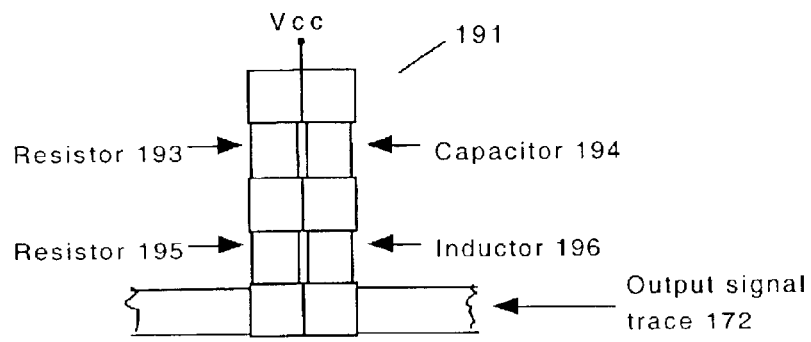
Figure 1E:
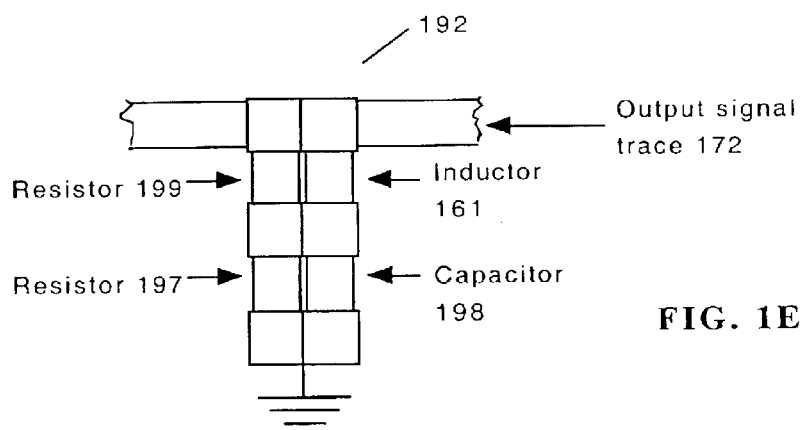

FIG. 1E illustrates a preferred configuration of the RLC circuit 191 and the RLC circuit 192. In the RLC circuit 191, a resistor 195 and an inductor 196 are connected in parallel to the output signal trace 172 and to another resistor 193 and capacitor 194, which are connected in parallel to a voltage source (Vcc). And in the RLC circuit 192, a resistor 199 and an inductor 161 are connected in parallel to the output signal trace 172 and to another resistor 197 and capacitor 198, which are connected in parallel to ground. Each of the resistors 193, 195, 197, 199 preferably has a resistance in the range of 5 to 50 ohms. Each of the capacitors 194, 161 preferably has a capacitance in the range of 0.1 to 10 picofarads (pF). And each of the inductors 196, 198 preferably has an inductance in the range of 2 to 12 nanoHenries (nH).

Figure 1F:
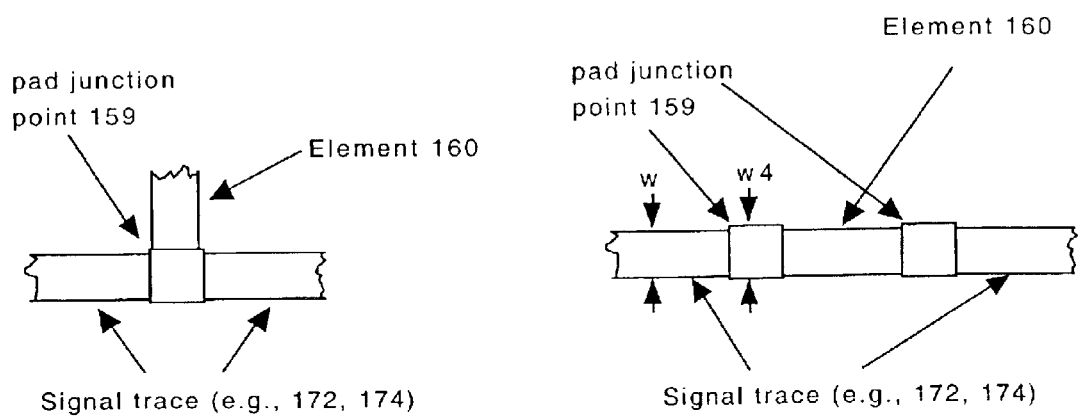

An important aspect of the laser driver circuit 170 is how the elements included in one or more of the C circuits 189, the RC circuits 190, and the RLC circuits 191, 192 are connected to signal traces 172, 174. As illustrated in FIG. 1F, the pads of elements 160 (e.g., resisters, inductors, capacitors, or other elements) are integrated into the output signal traces 172 such that the thickness of the output signal traces 172 is not increased at pad junction points 159 (e.g., the locations where the pads of elements 160 are integrated with the output signal traces 172). Additionally, the present invention breaks from standard signal trace construction by fixing the width w of the entire signal traces to approximate the width of the signal traces at the pad junction points 159. In a preferred embodiment, the width w of the output signal traces 172 is 17 mils and the width w4 of the output signal traces 172 at the pad junction points 159 is 20 mils. Preferably, the difference between the widths w and w4 are selected so that parasitic inductance created at pad junction points 159 is substantially offset by the parasitic capacitance created at pad junction points. In other words, the preferred configuration includes a slight increase of the width of the output signal traces 172 at the pad junction points 159, but no more than necessary to offset any parasitic capacitance created at the pad junction points 159. Preferably, the width of the output signal traces 172 at the pad junction points 159 is not greater than 125% of the width of other sections of the output signal traces 172.

FIG. 3A shows the base 124 at the back of the TO package 102 in one embodiment of the present invention. The signal contacts (leads) 112 carrying data signals and/or a power supply voltage extend through apertures in the base 124 of the TO package 102. The data signal contacts 112 contact resistors 162 on the circuit interconnect 104. The signal contacts 112 do not contact the base 124 of the TO package 102; rather, they extend through a dielectric 140, preferably a ring of glass, embedded in the base 124. Each dielectric ring 140 is concentric with one of the signal contacts 112. When the circuit interconnect 104 is bonded to the base of the TO package 102, the unmetalized insulator region 132 (FIG. 2) on the second side of the circuit interconnect overlaps the dielectric ring 140 in the base 124. For each data signal contact 112 (or at least each high frequency data signal contact), there is a conductive ground ring 106 that surrounds the dielectric 140, concentric with the contact 112 and the dielectric ring 140.

In some embodiments, the ground rings 106 are the only parts of the TO package that directly contact the ground signal conductor 116 of the circuit interconnect. In one embodiment, however, the ground signal conductor 116 is mechanically and electrically bonded to a large portion of the external, back surface of the base 124, in addition to the ground rings 106. Alternatively, additional ground contacts may be provided by signal leads connected to the TO package 102.

Figure 3B:
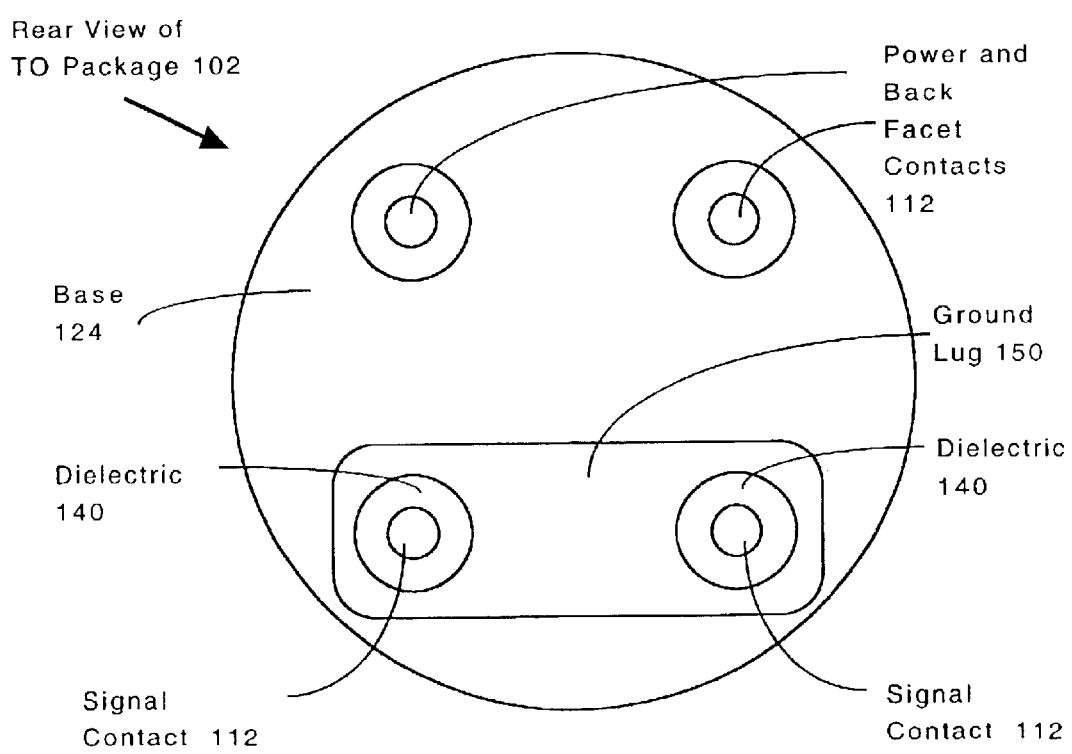

FIG. 3B depicts an alternate embodiment, in which a ground lug 150 is used instead of the ground rings 106 to provide a high quality ground connection to the base 124 and to prevent signal reflections in the high frequency data signal paths. The ground lug 150 is a preferably a highly conductive, thin metal lug bonded to the back, planar surface of the base 124, such as by solder, conductive epoxy, or any other appropriate bonding or conductive attachment mechanism. The ground lug 150 rises above the back planar surface of the base 124, which facilitates the bonding of the ground signal conductor 116 of the circuit interconnect 104 to the ground lug. Alternately, the ground lug 150 may be implemented as a raised region of the base 124, as an integral part of the base. The ground lug has two round (e.g., cylindrical) holes in it, aligned with the dielectric rings 140 surrounding the data signal contacts 112.

The use of a ground lug, instead of ground rings, typically does not require any change in the design of the circuit interconnect 104. As shown in FIG. 3B, the ground lug 150 is preferably positioned so as to surround the data signal contacts 112. If the TO package includes more than two high frequency data signal contacts 112, either the ground lug may be made larger or one or more additional ground lugs 150 may be positioned around those additional signal contacts 112 so as to provide a ground current path that is precisely positioned with respect to the data signal current flowing each of the data signal contacts 112.

The low impedance connection or bond between the ground signal conductor and the ground lug 150 is preferably formed by placing solder on the top surface of the ground lug or on the back surface of the ground signal conductor 116 and then soldering the ground signal conductor 116 to the ground lug 150. Alternately, the ground signal conductor 116 may be mechanically and electrically connected to the ground lug 150 using a conductive epoxy, or any other appropriate conductive attachment mechanism.

In yet another alternate embodiment, the base 124 of a TO package 102 may include both ground rings and ground lugs for forming ground current connections to the ground signal conductor 116 of the circuit interconnect 104.

Referring to FIG. 4, there is shown a transmitter optoelectronic assembly 400 in accordance with an embodiment of the present invention. The transmitter optoelectronic assembly 400 includes:

a laser diode 402, such as an edge emitter or other type of laser diode;

a laser submount 404, on which the laser diode is mounted; the laser submount 404 may be made of aluminum nitride or alumina ceramic; the laser submount 404 preferably incorporates one or more integrated or attached passive components, such as capacitors and inductors, to provide improved impedance matching and signal conditioning;

a laser pedestal 406 to which the submount 404 is attached; the laser pedestal 406 is a grounded, conductive structure having a partially concentric shape with respect to data signal contacts 412, 414 that extend through the base 124;

a monitor photo diode 408 for detecting the light emitted from a back facet of the laser diode 402 in order to monitor the intensity of the light emitted by the laser diode 402;

a monitor photo diode sub-mount 410 on which the monitor photo diode 408 is mounted; and a Transistor Outline (TO) package 420 incorporating controlled impedance glass-metal feedthroughs.

The partially concentric shape of the pedestal 406, which is held at the circuit ground potential, facilitates control of the impedance characteristics of the circuit that runs from the data signal contacts 412, 414, through bond wires 405 to the laser diode 402 and through the laser submount 404 and laser pedestal 406 of the TO package. In particular, the partially concentric shape of the pedestal 406 makes the data signal contacts 412, 414 operate as transmission lines, much like coaxial cables. The laser pedestal may be electrically and mechanically coupled to the base 124 of the TO package. Alternatively, the laser pedestal maybe integrally formed with the base 124 of the TO package.

The laser diode 402 is activated when a positive voltage is applied across the p-n junction of the laser diode 402. In the preferred embodiment, data signal contacts 412, 414 form a differential data signal connection. The two contacts 412, 414 are electrically connected to the laser submount 404 via bond wires 405 or any another appropriate connection mechanism. One terminal of the laser diode 402 is in direct contact with the laser submount 404 and is, therefore, electrically connected with one of the differential data signal contacts 414 via a corresponding one of the bond wires 405. The other data signal contact 412 is electrically connected to the laser diode 402 via a bond wire 405 to the submount 404 and another bond wire connecting the second terminal of the laser diode 402 to the submount 404. The differential signal provided by data signal contacts 412, 414 supplies both a bias voltage and a time varying signal voltage across the p-n junction of the laser diode 402.

Impedance matching within the TO package 102 may be improved by incorporating capacitors and/or inductors into the submount 404 for the laser diode 402 to provide a network(s) (e.g., an L network, C network, or LC network) that compensates for impedance presented by the bond wires 405 between the data signal contacts 412, 414 extending through the TO package and the submount connection points.

Figure 5:
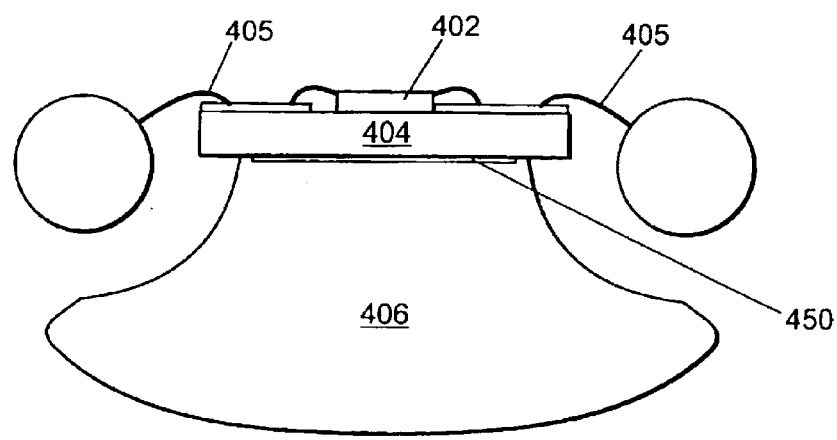
FIG. 5 is a front view of certain elements of a transmitter assembly in accordance with an alternate embodiment of the invention.

Typically, the bond wires 405 are made of gold but still have inductances of 1 to 5 nanoHenries. The inductance of the bond wires 405 is a function of bond wire length. In order to minimize the length of the bond wires 405, therefore, the width of the submount 404 is extended so that the length of the bond wires is minimized. FIG. 5 more clearly illustrates that the submount 404 extends beyond the pedestal 406 to shorten the distance between the submount 404 and the data signal contacts 412, 414. The reduced inductances of the short bond wires reduces or eliminates the need for incorporating capacitors and/or inductors into the submount 404 for the laser diode 402. The submount 404 does not create the inductances that the bond wires 404 would otherwise create because the submount 404 includes signal traces and a ground plane 450, and thus functions as a transmission line. The signal traces on the submount 404 are preferably configured so that their impedances match or approximately match the impedance of the data signal contacts 412, 414.

As indicated above, the submount 404 includes a ground plane 450. The ground plane may be formed by the pedestal itself, or by a metal layer on the submount that is bonded to the pedestal 406. The ground plane 450 covers only the portion of the submount 404 in contact with the pedestal 406. Because it does not extend beyond the contact area with the pedestal 406, the ground plane 450 does not interfere with the transmission characteristics of the data signal lines 412, 414. This is so because the partially concentric surfaces of the pedestal 406, which is grounded, remains the closest ground "plane" to the data signal lines 412, 414.

As is understood by one skilled in the art, when the laser diode 402 is an edge emitter the laser diode 402 emits light in both the forward direction and the backward direction, from forward and back facets. The forward direction refers to the direction in which light is transmitted through a window of the TO package, while the backward direction refers to the opposite direction. The laser intensity in the backward direction is proportional to the laser intensity in the forward direction. Thus, it is useful to measure the intensity of the laser in the backward direction in order to track the laser intensity in the forward direction. Accordingly, a monitor photo diode 408 is positioned facing the back facet of the laser diode 402. A power supply voltage contact 416 is connected to the monitor photo diode submount 410 by a bond wire. The monitor photo diode 408 is in contact with the monitor photo diode submount 410 and is connected to the monitor photo diode data signal contact 418 by a bond wire. Thus, the monitor photo diode 408 is reverse biased between the power supply and the data signal contact 418. The transmitter assembly of FIG. 4 is operated in conjunction with a circuit interconnect having four data signal traces. The circuit interconnect, not shown, is preferably similar to the one shown in FIG. 2, but having four data signal traces 114. Each data signal trace electrically interfaces a respective one of the data signal contacts 412, 414, 416, and 418.

Figure 6A:
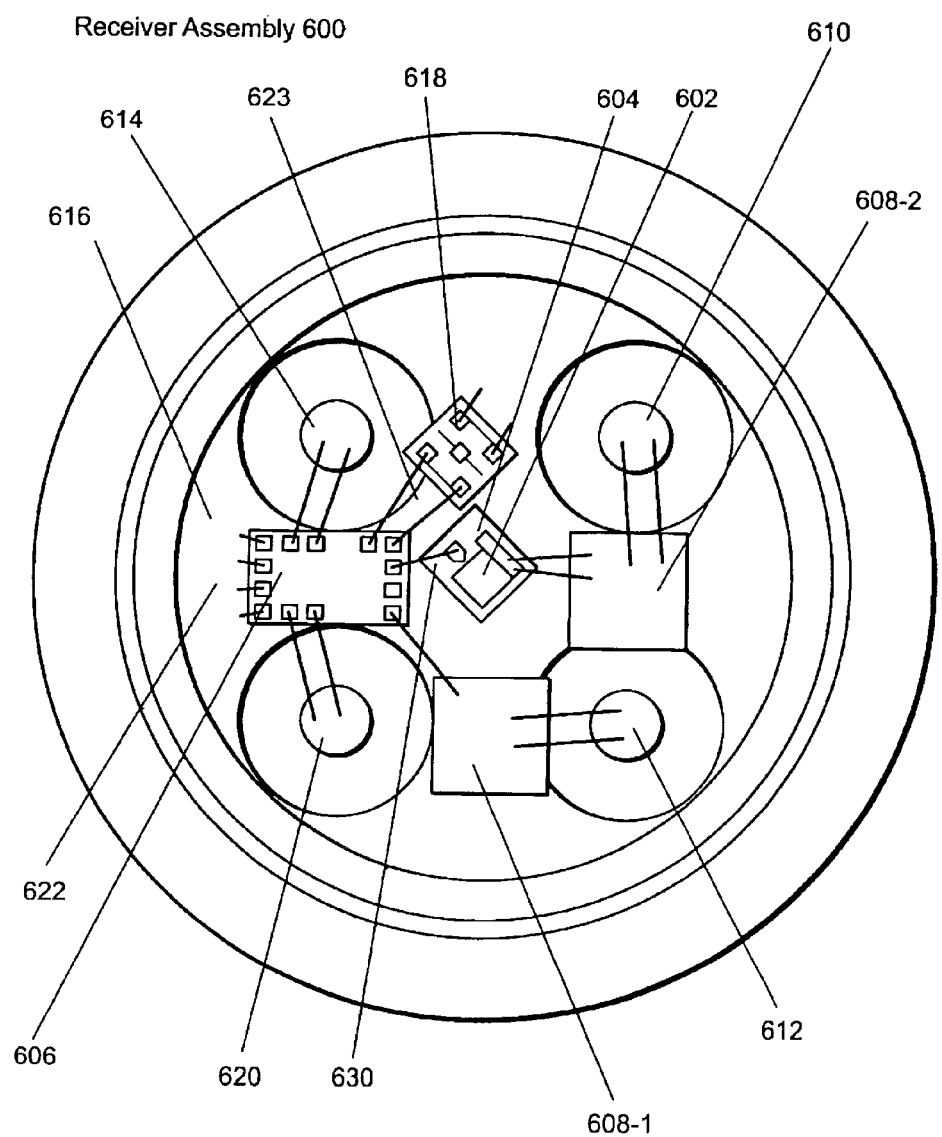
FIGS. 6A, 6B, 6C, and 6D are diagrams of a receiver assembly, and components thereof, in accordance with embodiments of the invention.

Referring to FIG. 6A, there is shown an embodiment of a receiver optoelectronic assembly 600 in accordance with the present invention. The receiver optoelectronic assembly includes:

a photo diode 602;

a photo diode submount 604;

an integrated circuit preamplifier 606 (e.g., a transimpedance amplifier) attached to the photo diode 602 and the submount 604 via a bond wire;

two bypass capacitors 608-1, 608-2;

a resistor 618; and a Transistor Outline (TO) package 616 incorporating controlled impedance glass-metal feedthroughs.

The photo diode 602 is positioned on the photo diode submount 604 and connected to the integrated circuit preamplifier 606 and to one of the two bypass capacitors 608-2 via bond wires. The photo diode 602 is configured to turn optical data signals into electrical signals, which are passed to, and amplified by, the integrated circuit preamplifier 606 via the bond wire. The bypass capacitor 608-2 is also connected via two bond wires to a signal contact 610, which provides the photo diode 602 with power. The bypass capacitor 608-2 sits atop the surface of the TO package 616, which is grounded. Because a bypass capacitor provides low impedance over certain high frequencies, high frequency noise is filtered from the power signal transmitted by the signal contact 610 before it reaches the photo diode 602.

The integrated circuit preamplifier 606 is connected to a bypass capacitor 608-1, which is connected to a signal contact 612 that supplies power to the integrated circuit preamplifier 606. Like the other bypass capacitor 608-2, this bypass capacitor 608-1 sits atop the surface of the TO package 616 and filters high frequency noise from the power signal transmitted by the signal contact 612. The integrated circuit preamplifier 606 transmits differential data signals through bond wires to signal contacts 614, 620. In the embodiment illustrated in FIG. 6A, the integrated circuit preamplifier 606 includes an input stage and an output stage within the same integrated circuit. The input stage receives data signals from the photo diode 602; the output stage outputs the differential data signals. In this embodiment, the power signal, transmitted by the signal contact 612 through the bypass capacitor 608-1 and the single bond wire to the integrated circuit preamplifier 606, is connected internally to both the input stage and the output stage. The ground connections for the input stage and the output stage are, however, separated. Four bond wires 622 provide a connection to ground for the output stage. Two bond wires 623 provide a ground connection for the input stage. Separate ground connections for the input stage and the output stage reduces feedback gain and suppresses oscillation in the integrated circuit preamplifier 606. In this embodiment, the grounds of the input stage and the output stage are connected through the grounded surface of the TO package 616. This is, however, a more attenuated connection than, for example, connecting the grounds of the input stage and the output stage on the integrated circuit preamplifier 606, and then connecting both to the surface of the TO package 616. The ground connection for the input stage, furthermore, includes a series connection to a resistor 618. The inclusion of the resistor 618 in the ground connection for the input stage also reduces feedback gain and suppresses oscillation in the integrated circuit preamplifier 606 by isolating the input stage from ground node voltage fluctuations in the output stage. The ground node voltage fluctuations are caused by parasitic inductance in the ground connection and correspond to current passing through the (parasitic) inductance of the ground connection. This phenomenon is commonly referred to as "ground bounce".

Figure 6B:
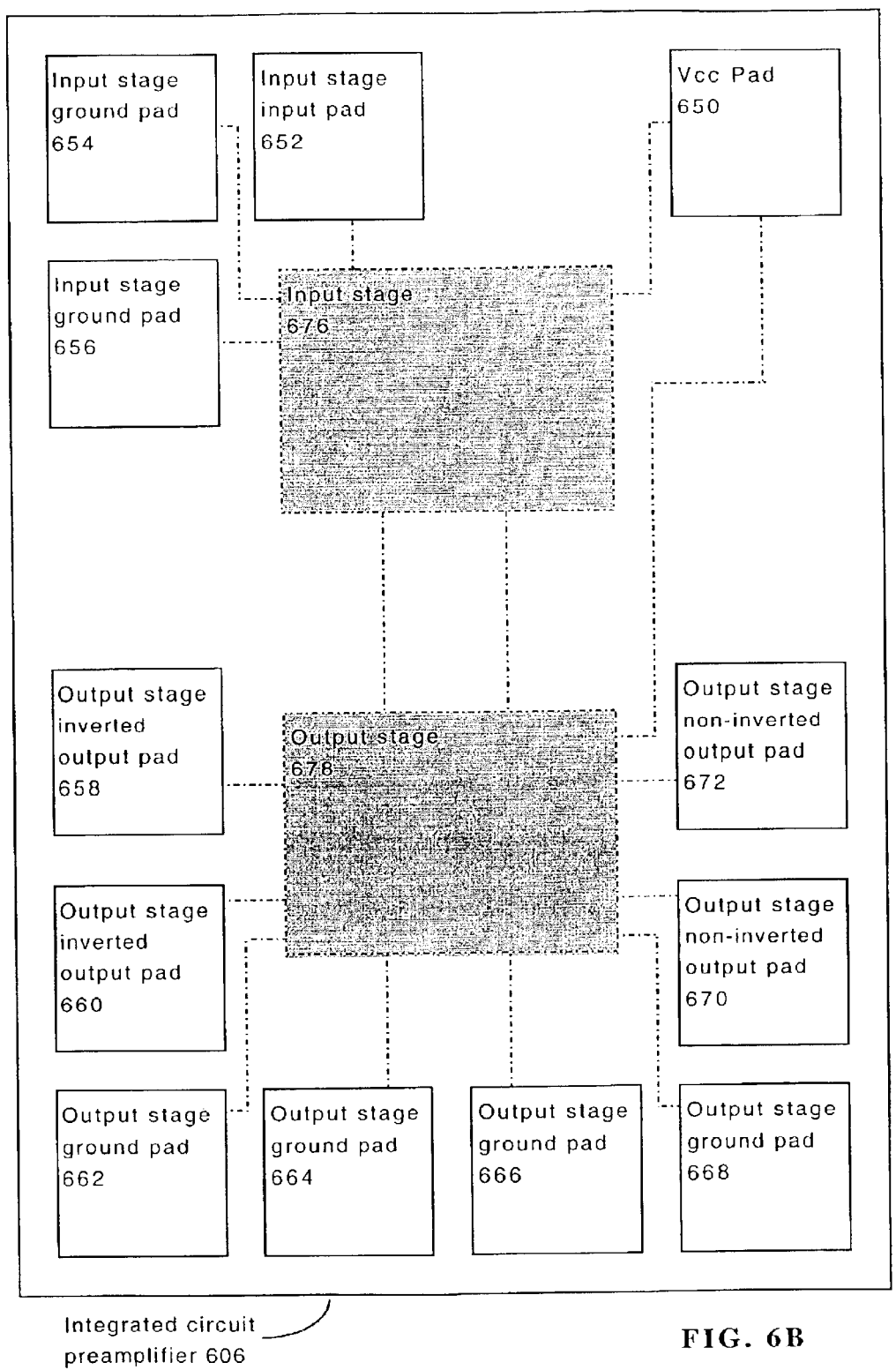

Referring to FIG. 6B, there is shown a more detailed illustration of the integrated circuit preamplifier 606. Included in the illustration are a Vcc pad 650, an input stage input pad 652, a first input stage ground pad 654, a second input stage ground pad 656, a first output stage inverted output pad 658, a second output stage inverted output pad 660, a first output stage ground pad 662, a second output stage ground pad 664, a third output stage ground pad 666, a fourth output stage ground pad 668, a first output stage output pad 670, a second output stage output pad 672, an input stage 676, and an output stage 678.

Briefly, the input stage 676 of the integrated circuit preamplifier 606 receives from the photo diode 602 a current that reflects the optical strength of a signal received by a corresponding TO package 102. The input stage 676 converts the current into two different voltage signals of equal amplitude, but 180 degrees out of phase with each other, and applies these differential voltage signals to the output stage 678 of the integrated circuit preamplifier 606. The output stage 678 amplifies the voltage signals produced by the input stage 676 and applies these amplified voltages to signal contacts.

In more detail now, the photo diode 602 is connected to the input stage input pad 652 via bond wire 630—as illustrated in FIG. 6A and 6B. The input to the input stage 676 (and the output from the photo diode 602) is typically a current, which the input stage 676 converts to two differential voltages that together reflect the magnitude of the input current. Typically, the two differential voltages are essentially equal in amplitude, but 180 degrees out of phase with each other (e.g., one may be positive and the other negative with respect to a center voltage).

The input stage 676 is typically an internal element so that the input stage 676 is connected to the input stage input pad 652 via an internal connection. FIG. 6B illustrates the internal nature of the input stage 676 and its connection to the input stage input pad 652 with dashed lines.

Also connected to the input stage 676 via internal connections are the Vcc pad 650, the first input stage ground pad 654, and the second input stage ground pad 656 as illustrated by additional dashed lines. As indicated above, the Vcc pad 650 is connected to a signal contact 612 for power via a bypass capacitor 608-1 and bond wires. The first input stage ground pad 654 and the second input stage ground pad 656 facilitate a connection between the input stage 676 and a resistor 618, which is connected to ground, via bond wires 623. In one embodiment, although not in some alternate embodiments, two or more connections to ground (via first input stage ground pad 654 and the second input stage ground pad 656) are preferably used in order to reduce inductance created by the bond wires. Persons skilled in the art recognize that the inductance of two inductors in parallel is computed by the following $$L_{total} = \frac{L_1 * L_2}{L_1 + L_2},$$

where $L_{total}$ is the total inductance of two bond wires in parallel and $L_1$ and $L_2$ are inductance values of a first and second inductor respectively. If the two inductance values are equal, the total inductance is equal to half the inductance of either bond wire alone.

Finally, input stage 676 is also connected, via connections typically internal to the integrated circuit preamplifier 606, to the output stage 678. As noted above, the output of the input stage comprises two voltages. More specifically, the output of the input stage comprises two voltage signals that are nominally identical in amplitude, but 180 degrees out of phase. Each of these two voltage signals is applied to a corresponding connection or input port of the output stage 678.

The output of the output stage 678 is connected to two signal contacts 614, 620 via four pads. The output stage 678 amplifies the difference between the two voltages from the input stage 676 and applies the amplified difference to the non-inverted output pads 672, 670 via two, separate connections that are typically internal to the integrated circuit preamplifier 606. These two pads are, in turn, connected via bond wires to one of the two signal contacts (e.g., 614). Like the ground connections described above in connection with the input stage 676, dual connections to a signal contact minimize inductance created by the connection to the signal contact.

At the same time, the output stage 678 also inverts the amplified difference and applies the result to the inverted output pads 658, 660 via two, separate connections that are typically internal to the integrated circuit preamplifier 606. Thus, the voltages applied to the non-inverted output pads and the inverted output pads, respectively, are nominally identical in amplitude, but 180 degrees out of phase. Additionally, the output pads 658, 660 are connected via bond wires to one of the two signal contacts (e.g., 620).

The output stage is also connected to the Vcc pad 650 and four ground pads, 662, 664, 666, 668 via connections typically internal to the integrated circuit preamplifier 606. The four ground pads, 662, 664, 666, 668 are in turn connected via separate bond wires to ground. As described in detail above, the use of leads, which are effectively inductors, in parallel reduces the overall inductance of the ground connection.

Note that the illustration of FIG. 6B is merely an exemplary layout of the integrated circuit preamplifier 606. The various elements of the integrated circuit preamplifier 606 identified (e.g., input stage 676 and output stage 678) are not limited to their respective size and position shown in FIG. 6B. Additionally, persons skilled in the art recognize that additional elements not illustrated or described herein are typically included in circuits such as the integrated circuit preamplifier 606.

Figure 6C:
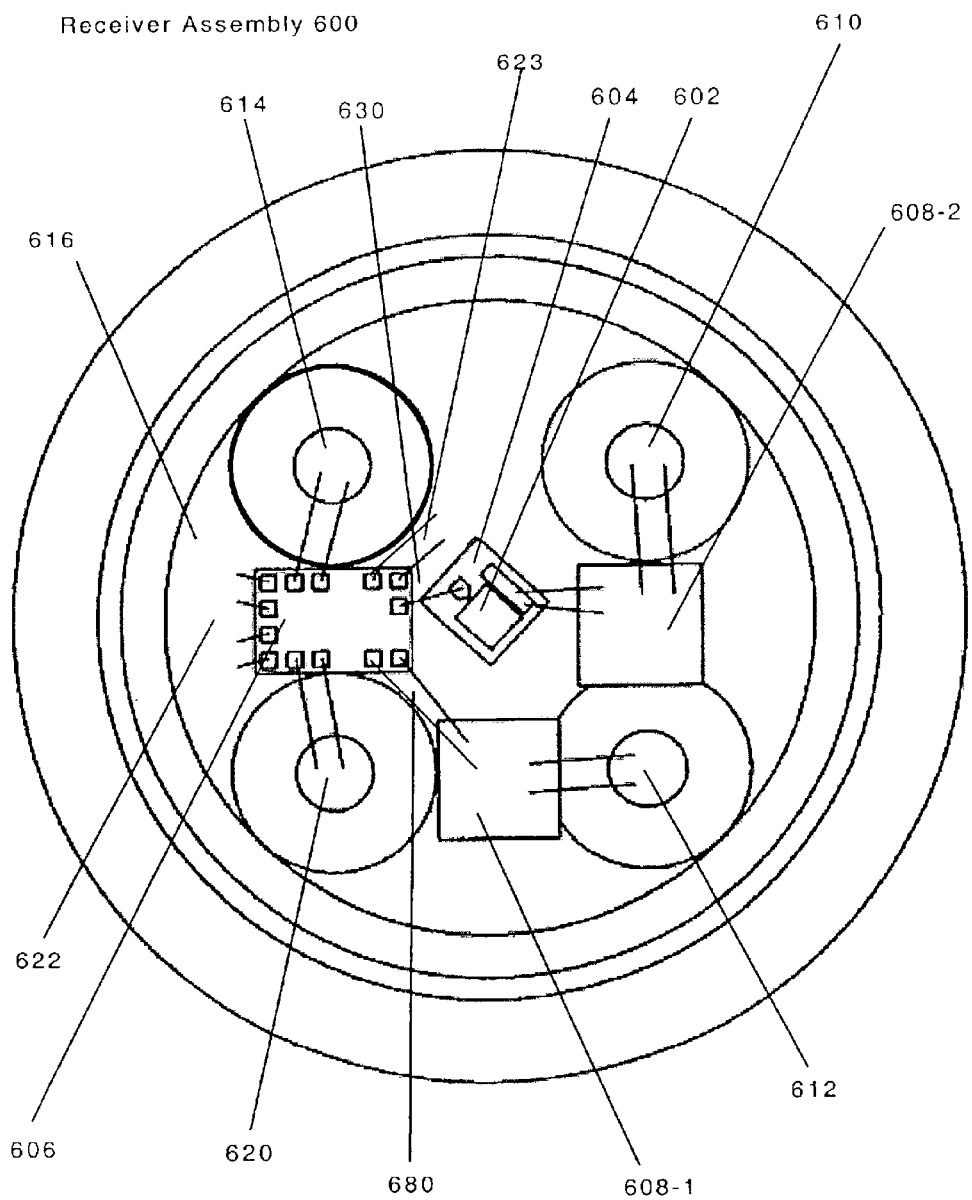

Referring to FIG. 6C, there is shown another embodiment of a receiver optoelectronic assembly 600 in accordance with the present invention. The receiver optoelectronic assembly includes:

a photo diode 602;

a photo diode submount 604;

an integrated circuit preamplifier 606 (e.g., a transimpedance amplifier) attached to the photo diode 602 and the submount 604 via a bond wire;

two bypass capacitors 608-1, 608-2; and a Transistor Outline (TO) package 616 incorporating controlled impedance glass-metal feedthroughs.

The photo diode 602 is positioned on the photo diode submount 604 and connected to the integrated circuit preamplifier 606 and to one of the two bypass capacitors 608-2 via bond wires. The photo diode 602 is configured to turn optical data signals into electrical signals, which are passed to, and amplified by, the integrated circuit preamplifier 606 via the bond wire. The bypass capacitor 608-2 is also connected via two bond wires to a signal contact 610, which provides the photo diode 602 with power. The bypass capacitor 608-2 sits atop the surface of the TO package 616, which is grounded. Because a bypass capacitor provides low impedance over certain high frequencies, high frequency noise is filtered from the power signal transmitted by the signal contact 610 before it reaches the photo diode 602.

Figure 6D:
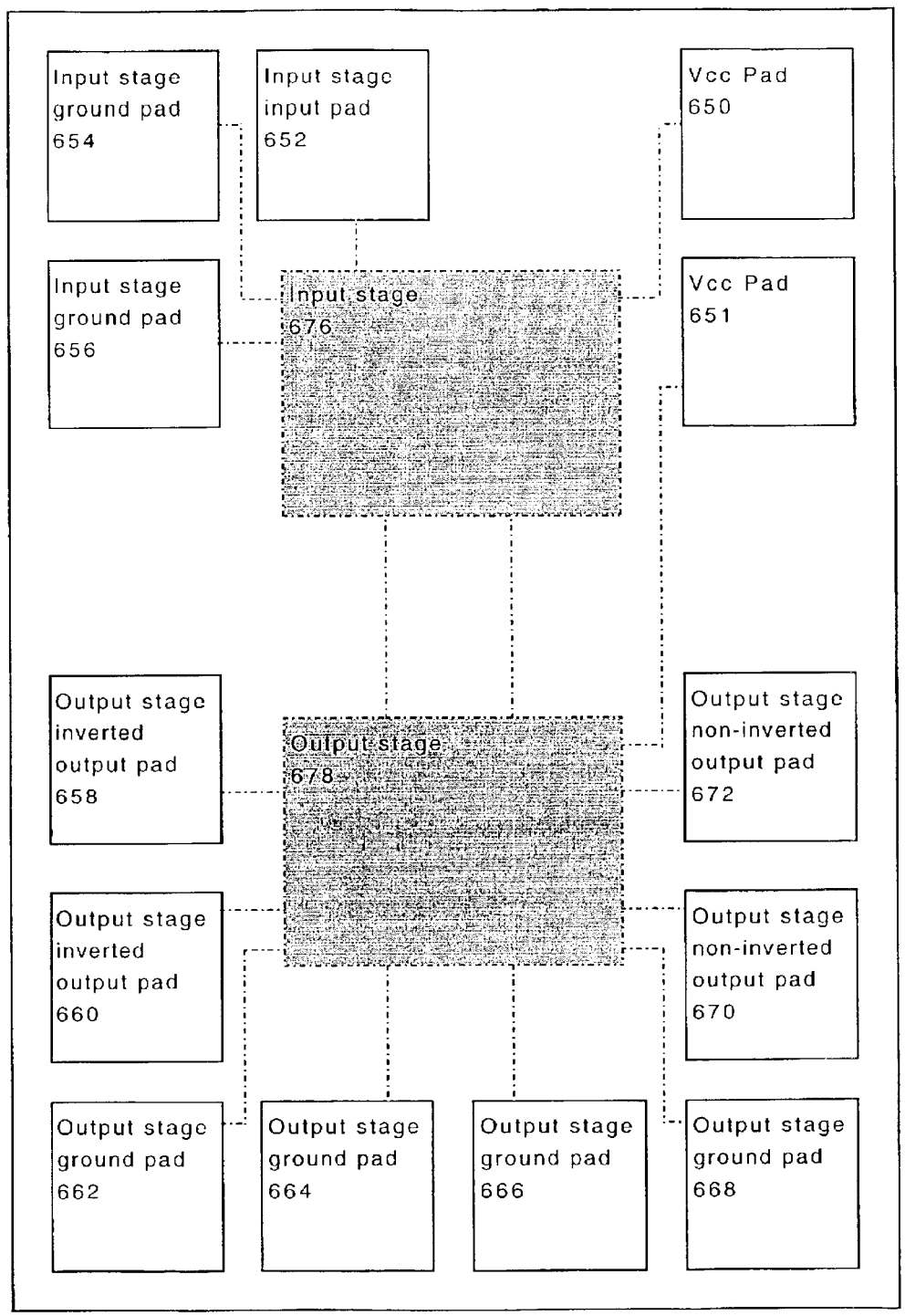

In the embodiment illustrated in FIGS. 6C and 6D, the integrated circuit preamplifier 606 includes an input stage and an output stage. The input stage receives the electrical data signals from the photo diode 602; the output stage produces differential data signals derived from the electrical data signals. The input stage and the output stage include separate connections 680 to a bypass capacitor 608-1, which is connected to a signal contact 612 that supplies power to the input stage and the output stage of the integrated circuit preamplifier 606. Like the other bypass capacitor 608-2, this bypass capacitor 608-1 filters high frequency noise from the power signal transmitted by the signal contact 612. Clearly, the power pads for the input stage and the output stage are connected via a capacitor 608-1. But because the capacitor offers low resistance to ground for certain high frequencies, some of the noise that would otherwise be transmitted between the input stage and the output stage is filtered by the intervening connection to the capacitor 608-1. The provision of separate bond wire connections 680 and pads 650, 651 for providing power to the input and output stages of the preamplifier 606 reduces feedback gain and suppresses oscillation in the integrated circuit preamplifier 606 by providing a small degree of isolation of the input stage from voltage supply fluctuations in the output stage. As noted above, bond wires have a defined amount of inductance. Because separate pads and bond wires are used to connect the input stage and the output stage to the signal contact, the inductance of the bond wires prevents feedback produced by the output stage from entering the input stage. More specifically, when operating at, for example, 6 GHz, a typical bond wire provides about 36 ohms of electrical isolation.

The ground connections for the input stage and the output stage are, like the power connections, separated. Four bond wires 622 provide a connection to ground for the output stage. Two bond wires 623 provide a ground connection for the input stage. These separate ground connections for the input and output stages also help to provide a degree of isolation between the input stage and output stage, thereby suppressing oscillation. In this embodiment, the resistor 618 of the embodiment shown in FIG. 6B is not included. Instead, bond wires 623 connect the input stage to circuit ground directly.

Referring to FIG. 6D, there is shown a more detailed illustration of the integrated circuit preamplifier 606. Since FIGS. 6B and 6D are similar in most respects, only the differences between FIGS. 6B and 6D will be described. In particular, the integrated circuit preamplifier 606 of FIG. 6D includes separate Vcc pads 650, 651 for the input stage 676 and output stage 678, respectively.

It should be noted that the illustration of FIG. 6D is merely an exemplary layout of the integrated circuit preamplifier 606. The various elements of the integrated circuit preamplifier 606 identified (e.g., input stage 676 and output stage 678) are not limited to their respective size and position shown in FIG. 6D. Additionally, persons skilled in the art recognize that additional elements not illustrated or described herein are typically included in circuits such as the integrated circuit preamplifier 606.

FIG. 7 shows an embodiment of an optoelectronic transceiver 700 in accordance with the present invention. The optoelectronic transceiver 700 includes a transmitter TO package 702 and receiver TO package 704. The transmitter TO package 702 houses a light source such as a laser diode, and the receiver TO package 704 houses a detector such as a photo diode. Data signals are transmitted from external electrical circuitry 710 to the transmitter TO package 702 via the transmitter circuit interconnect 706. The data signals from the detector are transmitted through the receiver TO package 704 to the external electrical circuitry 710 via the receiver circuit interconnect 708. Both the transmitter circuit interconnect 706 and the receiver circuit interconnect 708 ground their respective TO package through direct contact with the ground rings 712 (two of which are shown in FIG. 7) surrounding the data signal contacts 714.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. An optoelectronic device, comprising:
   a transistor outline housing;
   a photo diode within the transistor outline housing;
   an integrated circuit, within the transistor outline housing, the integrated circuit having an input amplifier stage and an output amplifier stage, the input amplifier stage having an input node coupled to the photo diode;
   the input amplifier stage configured to have a series connection to a first resistor, said first resistor connected to a ground node;
   the output amplifier stage configured to have a connection to the ground node, said connection not overlapping the series connection; and
   an output node, wherein the output amplifier stage is coupled to a signal contact through said output node.

2. The optoelectronic device of claim 1, wherein said first resistor is within the transistor outline housing and external to the integrated circuit.

3. The optoelectronic device of claim 1, further comprising a second resistor, wherein the input amplifier stage is configured to have a series connection to said second resistor, said second resistor connected to the ground node.

4. The optoelectronic device of claim 3, wherein
   each conductive connection between the input amplifier stage and said first and second resistors and
   each conductive connection between said first and second resistors and the ground node is formed by a bond wire, wherein said bond wire has an associated inductance.

5. The optoelectronic device of claim 3, wherein said second resistor is within the transistor outline housing and external to the integrated circuit.

6. The optoelectronic device of claim 1, further comprising
   a plurality of additional connections between the ground node and the output amplifier stage, each of said plurality of additional connections formed by a bond wire,
   wherein said bond wire is connected to both said ground node and said output amplifier stage, wherein said bond wire has an associated inductance.

7. The optoelectronic device of claim 1, further comprising one or more additional output nodes, wherein
each of said one or more additional output nodes connects the output amplifier stage to one of the signal contact and a second signal contact; and
at least one of said one or more additional output nodes is connected to the second signal contact.

8. The optoelectronic device of claim 7, wherein
each conductive connection between the output amplifier stage and the signal contact and
each conductive connection between the output amplifier stage and the second signal contact is formed by a bond wire, wherein said bond wire has an associated inductance.

9. The optoelectronic device of claim 1, wherein
the input amplifier stage and the output amplifier stage are connected to a voltage source pad, said voltage source pad connected by one or more bond wires to voltage source within the transistor outline housing,
wherein each of said one or more bond wires has an associated inductance.

10. An optoelectronic device, comprising:
a transistor outline housing;
a photo diode within the transistor outline housing;
an integrated circuit, within the transistor outline housing, the integrated circuit having an input amplifier stage and an output amplifier stage, the input amplifier stage having an input node coupled to the photo diode;
the input amplifier stage configured to have a series connection to a first resistor and a second resistor, each of said first and second resistors connected to a ground node;
wherein each conductive connection between the input amplifier stage and said first and second resistors and each conductive connection between said first and second resistors and the ground node is formed by a bond wire, wherein said bond wire has an associated inductance; and
the output amplifier stage configured to have a connection to the ground node, said connection not overlapping the series connection.

11. An optoelectronic device, comprising:
a transistor outline housing;
a photo diode within the transistor outline housing;
an integrated circuit, within the transistor outline housing, the integrated circuit having an input amplifier stage and an output amplifier stage, the input amplifier stage having, an input node coupled to the photo diode;
the input amplifier stage configured to have a series connection to a first resistor, said first resistor connected to a ground node,
the output amplifier stage configured to have a connection to the ground node, said connection not overlapping the series connection; and
a plurality of additional connections between the ground node and the output amplifier stage, each of said plurality of additional connections formed by a bond wire,
wherein said bond wire is connected to both the ground node and the output amplifier stage, wherein said bond wire has an associated inductance.

12. An optoelectronic device, comprising:
a transistor outline housing;
a photo diode within the transistor outline housing;
an integrated circuit, within the transistor outline housing, the integrated circuit having an input amplifier stage and an output amplifier stage, the input amplifier stage having an input node coupled to the photo diode;
the input amplifier stage configured to have a series connection to a first resistor, said first resistor connected to a ground node;
the output amplifier stage configured to have a connection to the ground node, said connection not overlapping the series connection;
the input amplifier stage and the output amplifier stage connected to a voltage source pad, said voltage source pad connected by one or more bond wires to voltage source within the transistor outline housing,
wherein each of said one or more bond wires has an associated inductance.

* * * * *

UNITED STATES PATENT AND TRADEMARK OFFICE
CERTIFICATE OF CORRECTION

| | |
|---|---|
| PATENT NO. | : 6,841,815 B2 |
| APPLICATION NO. | : 10/285204 |
| DATED | : January 11, 2005 |
| INVENTOR(S) | : Nguyen et al. |

It is certified that error appears in the above-identified patent and that said Letters Patent is hereby corrected as shown below:

Column 1
Line 32, before "also include" change "package" to --packages--

Column 4
Line 11, after "between" remove [of]
Line 13, change "contracts" to --contacts--

Column 7
Line 48, change "$\in_r$," to --$\varepsilon_r$--

Column 8
Line 65, change "resisters" to --resistors--

Column 9
Line 52, before "preferably" remove [a]

Column 10
Line 7, after "flowing" insert --through--
Line 65, change "another" to --other--

Column 12
Line 58, change "reduces" to --reduce--
Line 58, change "suppresses" to --suppress--

Column 13
Line 60, after "following" insert --equation:--

Signed and Sealed this

Twenty-third Day of November, 2010

David J. Kappos
*Director of the United States Patent and Trademark Office*